(12) United States Patent
Kim et al.

(10) Patent No.: US 8,421,326 B2
(45) Date of Patent: Apr. 16, 2013

(54) ELECTRODE, METHOD OF PREPARING THE SAME, AND ELECTRONIC DEVICE INCLUDING THE ELECTRODE

(75) Inventors: Won-Jong Kim, Suwon-si (KR);
Yong-Tak Kim, Suwon-si (KR);
Jong-Hyuk Lee, Suwon-si (KR);
Dae-Ho Yoon, Suwon-si (KR);
Seok-Gyu Yoon, Suwon-si (KR);
Hosono Hideo, Yokohama (JP)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 295 days.

(21) Appl. No.: 12/369,272

(22) Filed: Feb. 11, 2009

(65) Prior Publication Data
US 2009/0200913 A1 Aug. 13, 2009

(30) Foreign Application Priority Data

Feb. 13, 2008 (KR) ........................ 10-2008-0013095

(51) Int. Cl.
*H01J 1/00* (2006.01)
*H01M 4/38* (2006.01)
*C23C 14/08* (2006.01)

(52) U.S. Cl.
USPC ....................................... 313/311; 252/182.1

(58) Field of Classification Search .................. 313/633, 313/495–512; 445/24–25
See application file for complete search history.

(56) References Cited

U.S. PATENT DOCUMENTS

| | | | | |
|---|---|---|---|---|
| 6,972,078 B1* | 12/2005 | Tsou et al. | ............... | 204/290.14 |
| 2005/0287393 A1* | 12/2005 | Lee et al. | ....................... | 428/690 |
| 2006/0078760 A1* | 4/2006 | Ragini et al. | .................. | 428/690 |
| 2006/0151311 A1* | 7/2006 | Hosono et al. | ............. | 204/157.5 |
| 2006/0276326 A1* | 12/2006 | Hosono et al. | ................ | 501/153 |
| 2008/0265774 A1* | 10/2008 | Webster et al. | ............... | 313/587 |

FOREIGN PATENT DOCUMENTS

| | | |
|---|---|---|
| JP | P2005-314196 A | 11/2005 |
| JP | 2008-047434 | 2/2008 |
| WO | WO2006/129675 A1 | 12/2006 |
| WO | 2008023673 A1 | 2/2008 |

OTHER PUBLICATIONS

Registration Determination Certificate issued by the Korean Intellectual Property Office on Sep. 16, 2009.
Hosono, Hideo. "Recent Progress in Transparent Oxide Semiconductors: Materials and Device Application". *Elsevier*. 2006. pp. 6000-6014.
Korean Office Action issued by the Korean Intellectual Property Office on Mar. 27, 2009.
Japanese Office Action issued on Sep. 13, 2011 by the JPO in the corresponding Japanese patent application No. 2009-030850.
Japanese Office Action issued by the Japanese Patent Office on Jan. 10, 2012 in the corresponding Japanese Patent Application No. 2009-030850.

* cited by examiner

*Primary Examiner* — Anh Mai
*Assistant Examiner* — Elmito Breval
(74) *Attorney, Agent, or Firm* — Robert E. Bushnell, Esq.

(57) ABSTRACT

An electrode including metal oxides and a plurality of $12CaO \cdot 7Al_2O_3$ particles, a method of preparing the electrode, an electronic device including the electrode, and, in particular, an organic light emitting device including the electrode. The electrode has low resistance, high optical transmittance, and a low work function.

10 Claims, 6 Drawing Sheets

US 8,421,326 B2

ELECTRODE, METHOD OF PREPARING THE SAME, AND ELECTRONIC DEVICE INCLUDING THE ELECTRODE

CROSS-REFERENCE TO RELATED APPLICATION

This application claims the benefit of Korean Patent Application No. 2008-13095, filed Feb. 13, 2008 in the Korean Intellectual Property Office, the disclosure of which is incorporated herein by reference.

BACKGROUND OF THE INVENTION

1. Field of the Invention

Aspects of the present invention relate to an electrode, a method of preparing the electrode, and an electronic device including the electrode, and more particularly, to an electrode including a metal oxide and a plurality of $12CaO.7Al_2O_3$ particles, a method of preparing the electrode, an electronic device including the electrode, and specifically, an organic light emitting device including the electrode.

2. Description of the Related Art

Recently, demands have been increasing for transparent electrodes having low resistance, high degrees of optical transmittance, and low work functions for use in various electronic devices, specifically electronic devices related to emission of light. Examples of such specific electronic devices include organic light emitting devices (OLEDs). OLEDs are self-emitting, have higher brightness than liquid crystalline display devices, and can be thin because they do not use backlight units.

An OLED includes an anode, an organic layer, and a cathode that are sequentially stacked on a substrate in which a pixel circuit, such as a thin film transistor, is formed. OLEDs can be categorized into top-emission OLEDs and bottom-emission OLEDs. In a top-emission OLED, light is emitted in the direction opposite to the substrate on which the OLED is disposed, that is, light is emitted toward the cathode. Thus, top-emission OLEDs can have higher aperture ratios than bottom-emission OLEDs in which light is emitted toward the substrate. As a result, high light emission efficiency can be obtained in a top emission OLED. To achieve this, the cathode of the OLED should be transparent.

Such a transparent cathode can be formed of a transparent metal oxide, such as indium tin oxide (ITO). However, ITO has a limitation as a cathode material of an OLED because of its relatively high work function. The transparent cathode can also be formed of a metal alloy, such as MgAg. A metal alloy, such as MgAg, has low resistance and a low work function. However, even when the metal is a very thin film, for example, with a thickness of 15 nm, the optical transmittance in the visible spectrum is only about 30%. Therefore, conventional cathodes do not have ideal characteristics of sheet resistance, optical transmittance, or work function. Accordingly, there is a need to develop cathodes with improved characteristics of low sheet resistance, high optical transmittance and low work function.

SUMMARY OF THE INVENTION

Aspects of the present invention provide an electrode for various electronic devices with low resistance, high optical transmittance, and low work function. Aspects of the present invention also provide a method of preparing the electrode and an electronic device including the electrode.

One aspect of the present invention provides an electrode including a metal oxide and a plurality of $12CaO.7Al_2O_3$ particles. Another aspect of the present invention provides a method of preparing an electrode including a metal oxide and a plurality of $12CaO.7Al_2O_3$ particles, in which the metal oxide and $12CaO.7Al_2O_3$ are formed on a substrate by sputtering and deposition. Another aspect of the present invention provides an electronic device that includes the electrode, specifically an organic light emitting device including the electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
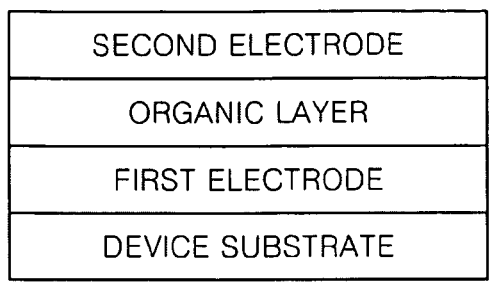
FIG. 1 is a schematic cross-sectional view of an organic light emitting device including an electrode according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

An electrode according to the present invention includes a metal oxide or bonded combination of metal oxides (hereinafter, both will be referred to as a metal oxide) and a plurality of $12CaO.7Al_2O_3$ particles (hereinafter, also "12C7A particles"). Specifically, in the electrode, the metal oxide forms a matrix and the $12CaO.7Al_2O_3$ particles are dispersed in the matrix of the metal oxide. For example, in one embodiment of the electrode, white $12CaO.Al_2O_3$ particles may be dispersed in the ITO matrix.

Although not limited to a specific principle, a $12CaO.7Al_2O_3$ particle has a lattice framework (crystal structure) composed of a nano-size cage (cell). Because the lattice framework of a $12CaO.7Al_2O_3$ particle has a positive charge equivalent to $+\frac{1}{3}$ per each cage ($2.32 \times 10^{-21}$ cm$^3$), the existence of compensating extra-framework anions inside the cages is inevitable. Therefore, an oxide ion, $O_2^-$, can occupy $\frac{1}{6}$ of the inner-cage. Since the oxide ion is likely responsible for the desired quick oxide-ionic conduction, the electrode including a metal oxide and $12CaO.7Al_2O_3$ particles according to aspects of the present invention can demonstrate excellent electric conductivity and thus obtain a low sheet resistance and low work function.

The metal oxide included in the electrode can be any material that has excellent optical transmittance, a low work function, and a low resistance. Such metal oxide can be ITO (Indium Tin Oxide), IZO (Indium Zinc Oxide), indium oxide ($In_2O_3$), zinc oxide (ZnO), $SnO_2$ (tin(IV) oxide), AZO (Aluminum Zinc Oxide or gahnite), GaZO (gallium zinc oxide or zinc gallate), GeZO (germanium zinc oxide), GaBZO (gallium boron zinc oxide), and SrRuO (strontium ruthenium oxide, more properly $SrRuO_3$), or combinations thereof, but is not limited thereto.

The minimum diameter of the $12CaO.7Al_2O_3$ particles may be 2 nm or more, preferably 5 nm or more. The maximum diameter of the $12CaO.7Al_2O_3$ particles may be 80 nm or less, preferably 60 nm or less, more preferably 40 nm or less, or most preferably 20 nm or less. When the minimum diameter of the $12CaO.7Al_2O_3$ particles is 2 nm or more, the electrode has sufficient work function characteristics. When the maximum diameter of the $12CaO.7Al_2O_3$ particles is 80 nm or less, the electrode has sufficient optical transmittance. For example, in one embodiment of the electrode, the minimum diameter of the $12CaO.7Al_2O_3$ particles in the electrode may be 2 nm and the maximum diameter of the $12CaO.7Al_2O_3$ particles in the electrode may be 10 nm.

The concentration of $12CaO.7Al_2O_3$ particles may be in the range of 0.1 parts by weight to 5 parts by weight, preferably in the range of 0.5 parts by weight to 2.5 parts by weight, based on the total weight of 100 parts by weight of the metal oxide and $12CaO.7Al_2O_3$ particles. When the concentration of $12CaO.7Al_2O_3$ particles is equal to or greater than 0.1 parts by weight, sufficient work function improvements can be obtained. On the other hand, when the concentration of the $12CaO.7Al_2O_3$ particles is equal to or smaller than 5 parts by weight, sufficient resistance improvements can be obtained.

Meanwhile, in the $12CaO.7Al_2O_3$ particles, the total concentration of Ca may be in the range of 0.1 parts by weight to 3 parts by weight, preferably in the range of 0.2 parts by weight to 1 part by weight, based on the total weight of 100 parts by weight of the metal oxide and $12CaO.7Al_2O_3$ particles. In the $12CaO.7Al_2O_3$ particles, the total concentration of Al may be in the range of 0.1 parts by weight to 3 parts by weight, preferably 0.2 parts by weight to 1 part by weight, based on the total weight of 100 parts by weight of the metal oxide and $12CaO.7Al_2O_3$ particles.

The concentration of Ca and Al can be determined by analyzing an electrode according to an embodiment of the present invention using, for example, an electron probe microanalyzer. For example, the concentration of $12CaO.7Al_2O_3$ particles in an electrode according to an embodiment of the present invention can be measured based on such concentration ranges of Ca and Al and the compositional formula of $12CaO.7Al_2O_3$ and ITO.

The electrode described above may be prepared by forming the metal oxide and $12CaO.7Al_2O_3$ on a substrate using known sputtering or deposition methods. The substrate can be any common support that includes a region on which the electrode described above is to be formed. The material of the substrate may vary according to the structure of a target electronic device. For example, in the organic light emitting device described in FIG. 1, when the first electrode is the electrode according to that embodiment of the present invention, the substrate can be the device substrate. Furthermore, when the second electrode is the electrode according to another embodiment of the present invention, the substrate can be the organic layer.

In a method of synthesizing a $12CaO.7Al_2O_3$ source to be used to prepare the electrode according to an embodiment of the present invention, first, $CaCO_3$ powder and $Al_2O_3$ powder are combined to yield the chemical formula of $12CaO.7Al_2O_3$. The mixed powder is then heat-treated in a temperature range of 1300° C. to 1350° C. for 2 hours to 12 hours to obtain a solid product of $12CaO.7Al_2O_3$. The solid product of $12CaO.7Al_2O_3$ is then further heat treated in a temperature range of 1300° C. to 1700° C. in a carbon crucible for 1 hour to 3 hours to obtain a $12CaO.7Al_2O_3$ pellet. The $12CaO.7Al_2O_3$ pellet is ground to the desired particle size, thereby obtaining a $12CaO.7Al_2O_3$ source.

The sputtering method can be any known sputtering method, such as an rf magnetron sputtering method. The deposition method can be any known deposition method, such as an electron-beam deposition method.

The method of preparing an electrode according to an embodiment of the present invention may be performed under a gaseous mixture atmosphere including Ar, $H_2$ and $O_2$. In this regard, the partial pressure of $O_2$ may be in the range of 0.3% to 3%, preferably 0.8% to 2.2%. When the partial pressure of $O_2$ is within such a range, an electrode including $12CaO.7Al_2O_3$ particles having the diameter ranges and desired concentration ranges described above can be obtained. For example, in a gaseous mixture including Ar, 4% $H_2$ and $O_2$, the partial pressure of $O_2$, that is, $O_2/(Ar4H2+O2)$ as captioned in FIG. 2, may be in a range of 0.8% to 2.2%.

In the method of preparing an electrode according to the present invention, the sputtering method can be performed in a temperature range of 25° C. to 100° C., preferably 40° C. to 80° C. When the electrode is prepared in such a temperature range, the substrate should have minimum defects.

The electrode according to this embodiment of the present invention may have a sheet resistance of, for example, 40 ohm/sq. to 500 ohm/sq. Also, the electrode according to this embodiment of the present invention may have an optical transmittance of 90% or more, preferably 91% or more, 92% or more, 93% or more, 94% or more, 95% or more, 96% or more, 97% or more, 98% or more, 99% or more, and more preferably 100%, with respect to the visible spectrum. Meanwhile, the electrode according to this embodiment of the present invention may have a work function of, for example, 4.0 eV to 4.6 eV, preferably 4.2 eV to 4.5 eV.

The electrode according to this embodiment of the present invention may have a thickness of 50 nm to 200 nm, preferably 80 nm to 150 nm. With such a wide thickness range, the thickness of the electrode may differ according to the type of target device.

The electrode according to this embodiment of the present invention can be used as an electrode in various electronic devices related to light emission. Examples of the electronic devices are organic light emitting devices, solar cells and semiconductor devices.

FIG. 1 is a schematic cross-sectional view of an organic light emitting device including an electrode according to an embodiment of the present invention. The organic light emitting device has a sequential structure of a device substrate, a first electrode, an organic layer, and a second electrode. In this regard, the second electrode can be a transparent electrode according to an aspect of the present invention.

The device substrate can be any material that is used in conventional organic light emitting devices. For example, the device substrate can be formed of glass or plastic. The structure of the device substrate may vary according to the device to be formed. For example, the device substrate may further include a pixel circuit in which a thin film transistor is assembled with a capacitor, if required.

The first electrode may be formed of a high work function material that enables easy hole injection into the organic layer. For example, the first electrode may be a reflective film, a semi-transparent film, or a transparent film, each of which is formed of: one or more elements selected from the group consisting of Ag, Mg, Al, Pt, Pd, Au, Ni, Nd, Ir, Cr, Ca, and In; or one oxide selected from the group consisting of indium oxide, indium tin oxide, zinc oxide, and indium zinc oxide.

The organic layer may include one or more layers selected from the group consisting of a hole injection layer, a hole transport layer, an emission layer, a hole blocking layer, an electron transport layer, and an electron injection layer. Holes supplied from the first electrode may be recombined with electrons supplied from the second electrode in the organic layer, thereby emitting light.

The emission layer may be formed of known light emitting materials, for example, a known host and a known dopant. The host may be selected from Alq$_3$, CBP(4,4'-N,N'-dicarbazole-biphenyl), PVK(poly(n-vinylcarbazole)), and DSA (distyrylarylene). A blue dopant may be selected from oxadiazole dimer dyes (Bis-DAPOXP), spiro compounds(Spiro-DPVBi, Spiro-6P), bis(styryl)amine(DPVBi, DSA), F$_2$Irpic, (F$_2$ppy)$_2$Ir(tmd), Ir(dfppz)$_3$, and ter-fluorene. A green dopant may be selected from Coumarin 6, C545T, Quinacridone, and Ir(ppy)$_3$ (ppy=phenylpyridine), Ir(ppy)$_2$(acac), and Ir(mpyp)$_3$. A red dopant may be selected from PtOEP, Ir(piq)$_3$, Btp$_2$Ir(acac), Eu(thenoyltrifluoroacetone)3 (Eu(TTA)3, and butyl-6-(1,1,7,7,-tetramethyljulolidyl-9-enyl)-4H-pyran (DCJTB). The molecular structures of some of the materials are shown below.

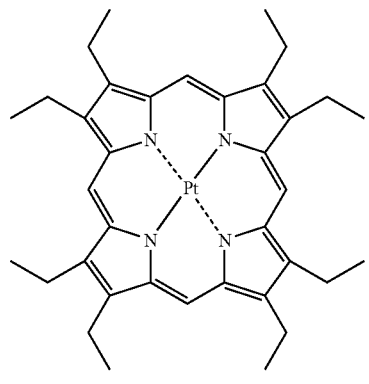

PtOEP

-continued

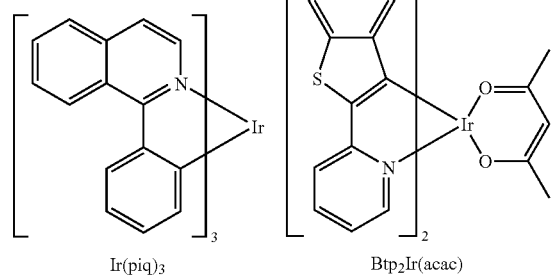

Ir(piq)$_3$     Btp$_2$Ir(acac)

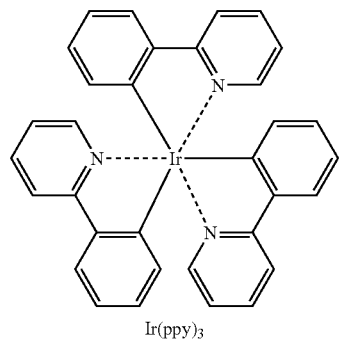

Ir(ppy)$_3$

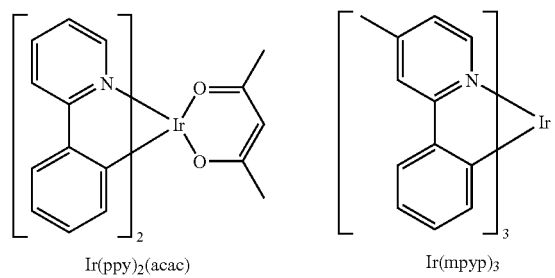

Ir(ppy)$_2$(acac)     Ir(mpyp)$_3$

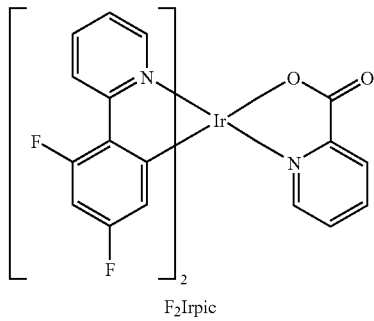

F$_2$Irpic

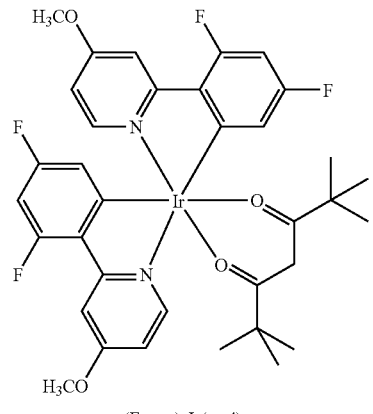

(F$_2$ppy)$_2$Ir(tmd)

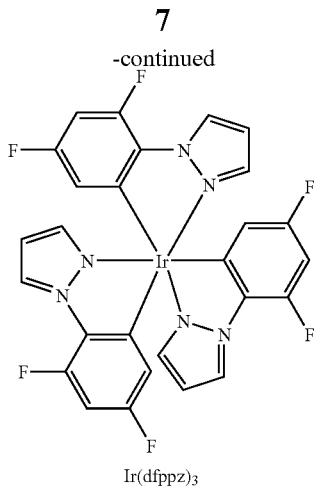

Ir(dfppz)₃

The concentration of the dopant may be in the range of 0.1 to 20 parts by weight, preferably in the range of 0.5 to 12 parts by weight, based on 100 parts by weight of an emission layer forming material (for example, the total weight of the host and the dopant is 100 parts by weight.) When the dopant has such a concentration range, concentration quenching can be substantially prevented.

The emission layer can also be formed of one or more materials selected from the group consisting of a polyphenylenevinylene(PPV)-based polymer and a derivative thereof, a polyphenylene(PPP)-based polymer and a derivative thereof, a polythiophene (PT)-based polymer and a derivative thereof, polyfluorene(PF)-based polymer and a derivative thereof, and polyspirofluorene(PSF)-based polymer and a derivative thereof.

The hole injection layer material is not limited and, for example, can be copper phthalocyanine (CuPc); a starburst-type amine, such as TCTA or m-MTDATA; or a soluble, conductive polymer, such as polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or (polyaniline)/poly(4-styrenesulfonate) (PANI/PSS). The molecular structures of TCTA and m-MTDATA are shown below.

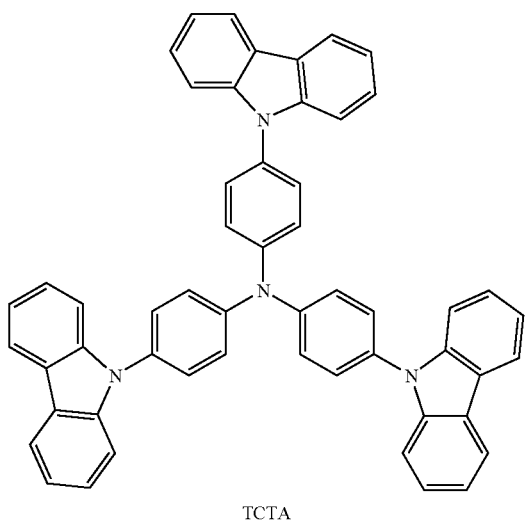

TCTA

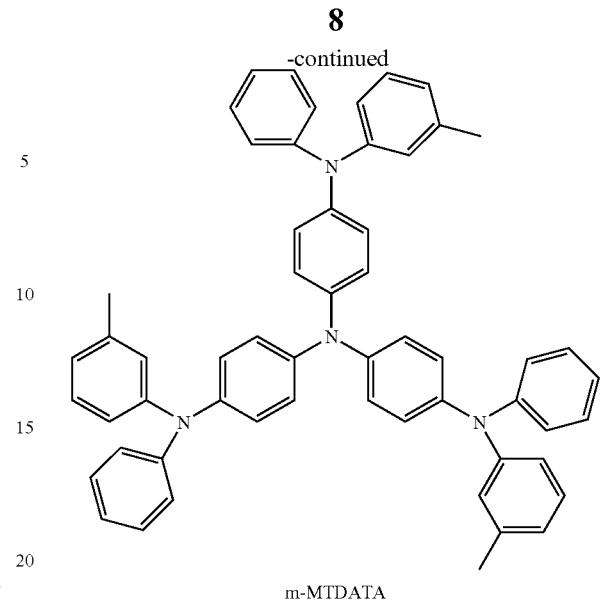

m-MTDATA

The thickness of the hole injection layer may be in the range of about 100 Å to 10000 Å, preferably in the range of 100 Å to 1000 Å. When the hole injection layer has such thickness range, excellent hole injection properties can be obtained and most unwanted operating voltage increases can be prevented.

The hole transport layer material is not limited and, for example, can be formed of a material including one or more compounds selected from the group consisting of a compound having a carbazole group and/or arylamine group which transports holes, a phthalocyanine-based compound and a triphenylene derivative. Specifically, the hole transport layer may include one or more compounds selected from the group consisting of 1,3,5-tricarbazolylcarbazolyl benzene, 4,4'-biscarbazolylbphenyl, polyvinylcarbazole, m-biscarbazolylphenyl, 4,4'-biscarbazolyl-2,2'-dimethylbiphenyl, 4,4', 4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4, 4'diamine(TPD), N,N'-di(naphthalene-1-yl)-N,N'-diphenyl benzidine(α-NPD), N,N'-diphenyl-N,N'-bis(1-naphthyl)-(1, 1'-biphenyl)-4,4'-diamine(NPB), poly(9,9-dioctylfluorene-co-N-(4-butylphenyl)diphenylamine) (TFB) and poly(9,9-dioctylfluorene-co-bis-N,N-phenyl-1,4-phenylenediamine (poly(9,9-dioctylfluorene-co-bis-(4-butylphenyl-bis-N,N-phenyl-1,4-phenylenediamin) (PFB), and poly(9,9-dioctylfluorene-co-bis-N,N-(4-butylphenyl)-bis-N,N-phenylbenzidine)(BFE). The molecular structures of TPD and α-NPD are shown below.

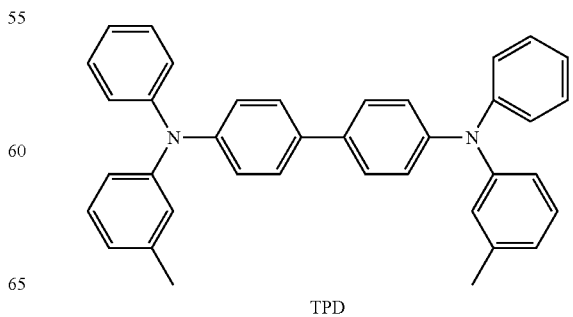

TPD

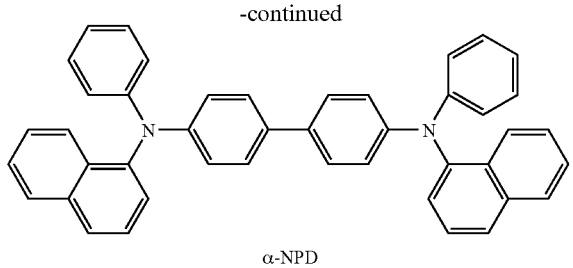

α-NPD

The thickness of the hole transport layer may be in the range of about 50 Å to 1000 Å, preferably in the range of 100 Å to 600 Å. When the hole transport layer has such a thickness range, excellent hole transporting characteristics can be obtained and an unwanted increase in operating voltage can be prevented.

The hole blocking layer (HBL) can be included in the organic layer when the emission layer includes a phosphorescent dopant. In this regard, the HBL can be formed of any known hole blocking layer forming material. For example, the HBL can be formed of an oxadiazole derivative, a triazole derivative, a phenanthroline derivative, Balq, or BCP.

The thickness of the HBL may be in the range of about 50 Å to 1000 Å, preferably in the range of 100 Å to 300 Å. When the HBL has such a thickness range, excellent hole blocking characteristics can be obtained and an unwanted increase in operating voltage can be prevented.

The thickness of the electron transport layer may be in the range of about 100 Å to 1000 Å, preferably in the range of 100 Å to 500 Å. When the electron transport layer has such a thickness range, excellent electron transporting characteristics can be obtained and an excessive operating voltage can be prevented.

The electron transport layer may be formed by vacuum-deposition or spin coating an electron transporting material on the emission layer. The electron transporting material is not limited and can be any known electron transporting material, such as tris(8-quinolinorate)aluminium ($Alq_3$), TAZ, or Bebq2(bis(10-hydroxybenzo[h]quinolinato)beryllium).

An electron injection layer can be formed on the electron transport layer using a vacuum deposition method or a spin coating method. An electron injection layer forming material may be, but is not limited to, $BaF_2$, LiF, NaF, $MgF_2$, $AlF_3$, $CaF_2$, NaCl, CsF, $Li_2O$, BaO, or Liq.

The second electrode can be an electrode according to an embodiment of the present invention. Therefore, light generated in an organic layer interposed between the first electrode and the second electrode can effectively be emitted with high optical transmittance toward the outside through the second electrode. Thus, an organic light emitting device according to this embodiment of the present invention has excellent external light emission efficiency. Also, since the second electrode has, in addition to high optical transmittance, low sheet resistance and a low work function, electrons can be effectively injected into the second electrode from the organic layer, and thus internal efficiency can also be improved. As a result, an organic light emitting device employing an electrode according to this embodiment of the present invention can display an image of high quality.

Embodiments of the present invention will be described in further detail with reference to the following examples. These examples are for illustrative purposes only and are not intended to limit the scope of the present invention.

EXAMPLE $CaCO_3$ and $Al_2O_3$ were combined to yield the chemical formula of $12CaO.7Al_2O_3$. The combined $CaCO_3$ and $Al_2O_3$ were heated at 1300° C. for 12 hours to obtain $12CaO.7Al_2O_3$ powder. Then, the $12CaO.7Al_2O_3$ powder was pressed to obtain a solid product. The solid product was heat treated at 1500° C. for 2 hours to obtain a $12CaO.7Al_2O_3$ pellet. The $12CaO.7Al_2O_3$ pellet was ground to the desired particle size to obtain a $12CaO.7Al_2O_3$ source.

Then, the $12CaO.7Al_2O_3$ source and an ITO source that had been prepared in advance were co-sputtered onto a glass substrate, thereby obtaining a 200 nm-thick electrode in which $12CaO.7Al_2O_3$ particles were dispersed in an ITO matrix. In this regard, the co-sputtering was performed while the partial pressure of $O_2$ in a gaseous mixture of Ar, 4% $H_2$ and $O_2$ was varied according to Table 1. In this manner, eight electrodes having a thickness of 200 nm (Sample 1 to 8) were manufactured. The co-sputtering was performed under the conditions shown in Table 2.

TABLE 1

| Sample No. | Partial Pressure of $O_2$ (%) |
|---|---|
| 1 | 0.8 |
| 2 | 1.0 |
| 3 | 1.2 |
| 4 | 1.4 |
| 5 | 1.6 |
| 6 | 1.8 |
| 7 | 2.0 |
| 8 | 2.2 |

TABLE 2

| | |
|---|---|
| Sputter product name and sputter manufacturer | HSR-521A (Shimadzu) |
| Base pressure | <2 × $10^{-6}$ Torr |
| Working pressure | 1 mTorr |
| Process Gas | $H_2$ 4% Ar and $O_2$ |
| Distance between target and substrate | 50 mm |
| Power | 200 W |
| Substrate temp. | 60° C. |

Comparative Example

An electrode was prepared in the same manner as in the Example except that a $12CaO.7Al_2O_3$ source was not used, only the ITO source was used, and the partial pressure of $O_2$ was in a range of 0% to 15%. The obtained electrode is Sample A.

Assessment Example 1

Sheet Resistance Assessment

Figure 2:
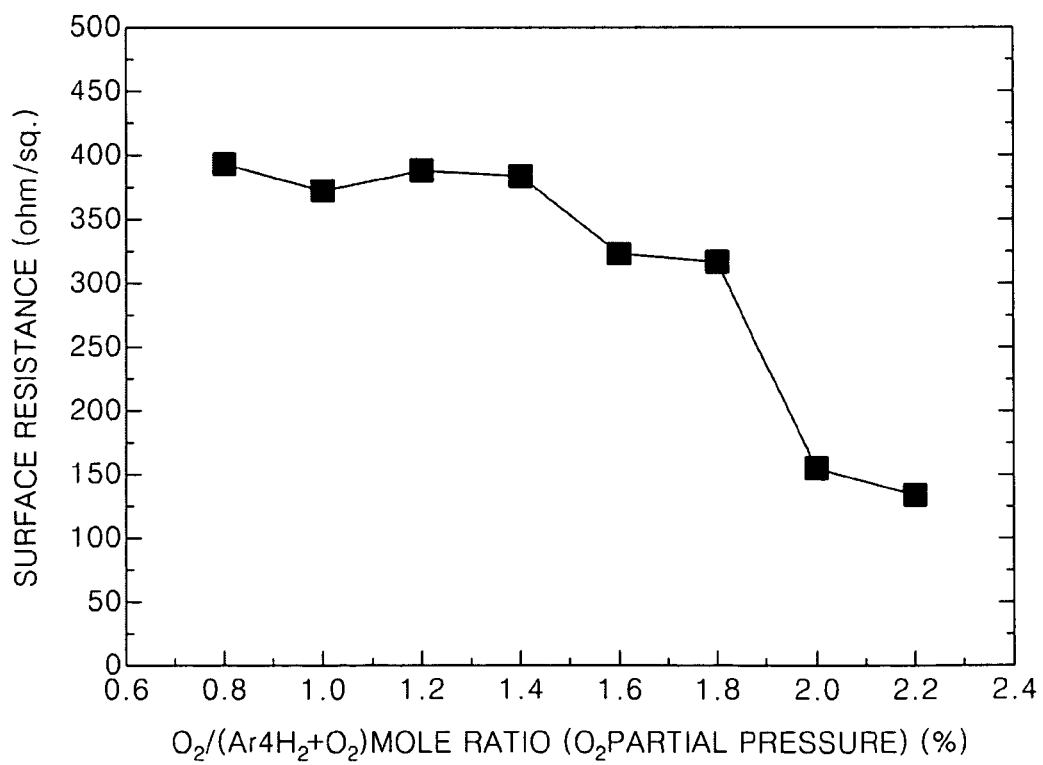
FIG. 2 is a graph of sheet resistance of an electrode as a function of composition according to embodiments of the present invention.

The sheet resistance of Samples 1 to 8 was measured using a 4-point probe (100 MP, ChangMin). The results are shown in FIG. 2. Referring to FIG. 2, an electrode according to the present invention has low sheet resistance. In particular, Sample 8, in which the partial pressure of $O_2$ was 2.2%, shows a sheet resistance of 100 ohm/sq.

Assessment Example 2

Optical Transmittance Assessment

Figure 3:
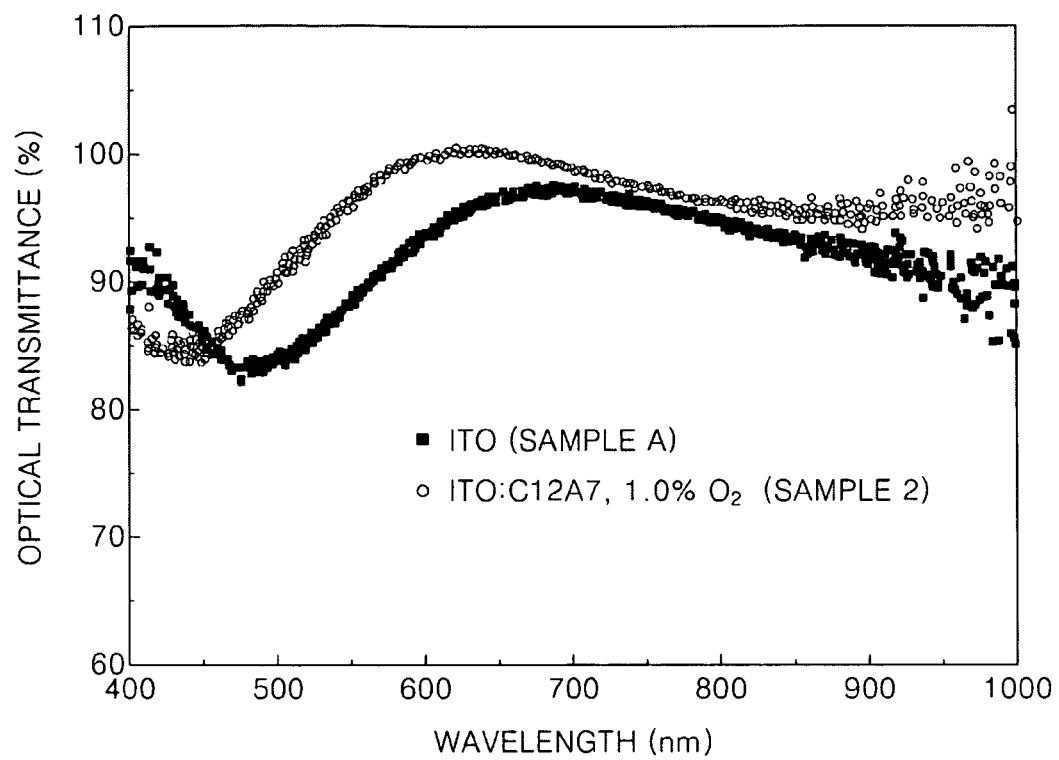
FIG. 3 is a graph of optical transmittance as a function of wavelength for an electrode according to embodiments of the present invention.

The optical transmittances of Sample A and Sample 2 were measured in the spectral range of 400 nm to 1000 nm. The results are shown in FIG. 3. The optical transmittance was measured using a UVS-2100 (Scinco). Referring to FIG. 3, it can be seen that the optical transmittance of Sample 2 at a wavelength of 555 nm (in the visible spectrum) was higher than the optical transmittance of Sample A, which does not include $12CaO.7Al_2O_3$ particles.

Figure 4:
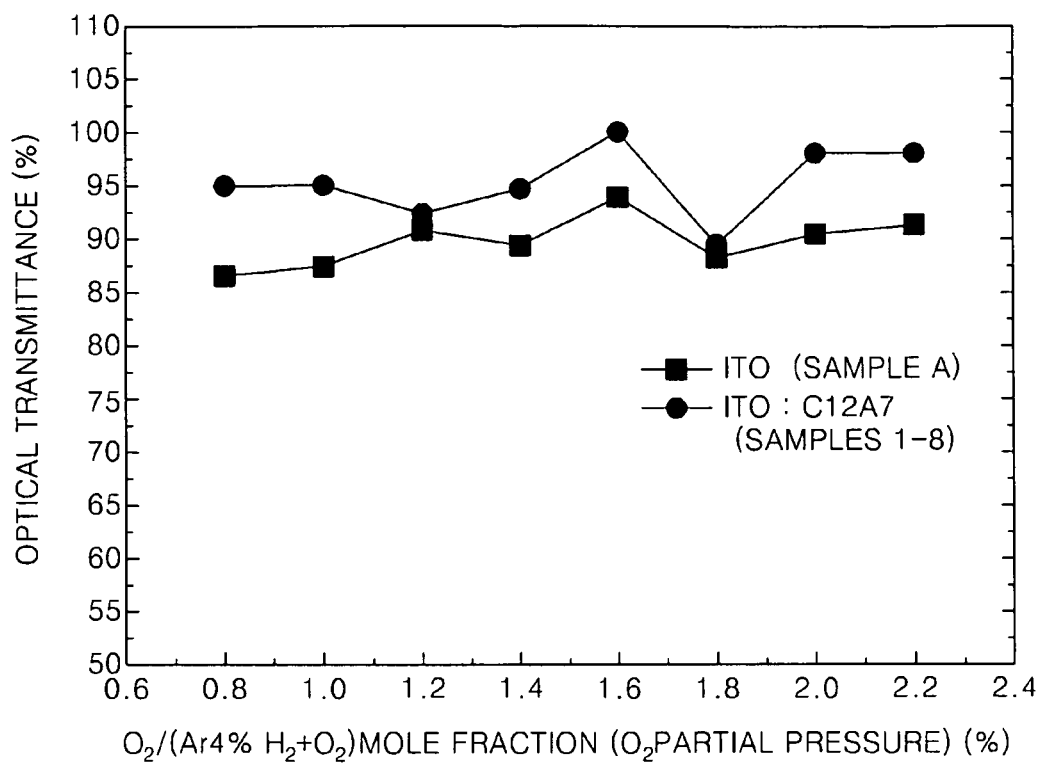
FIG. 4 is a graph of optical transmittance of an electrode at a wavelength of 555 nm as a function of composition according to embodiments of the present invention.

FIG. 4 is a graph of the optical transmittance at a wavelength of 555 nm for Sample A and Samples 1 to 8. Referring to FIG. 4, it can be seen that the optical transmittance of Samples 1 to 8 is equal to or greater than the optical transmittance of Sample A.

Assessment Example 3

Work Function Assessment

Figure 5:
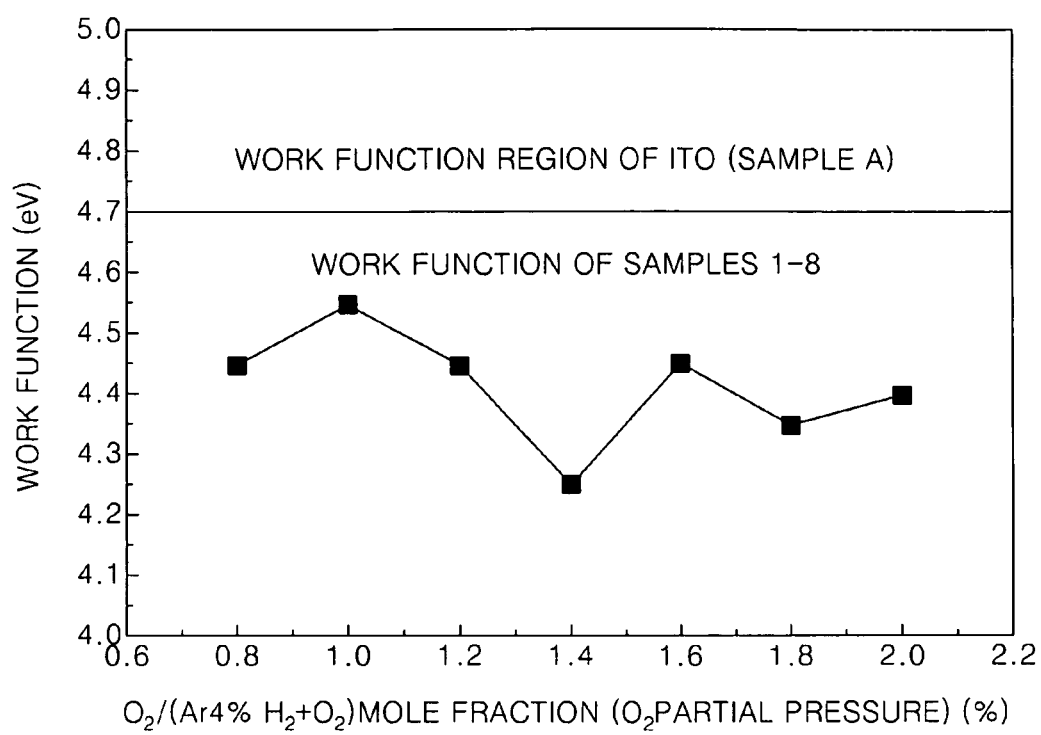
FIG. 5 is a graph of work function of an electrode as a function of composition according to embodiments of the present invention.

FIG. 5 shows the work function of Samples 1 to 8 and the work function region of Sample A. The work function of Sample A, which does not include $12CaO.7Al_2O_3$ particles, was about 4.7 eV or more, but the work function of Samples 1 to 8 was in a range of 4.2 eV to 4.5 eV.

Assessment Example 4

Surface Observation

Figure 6:
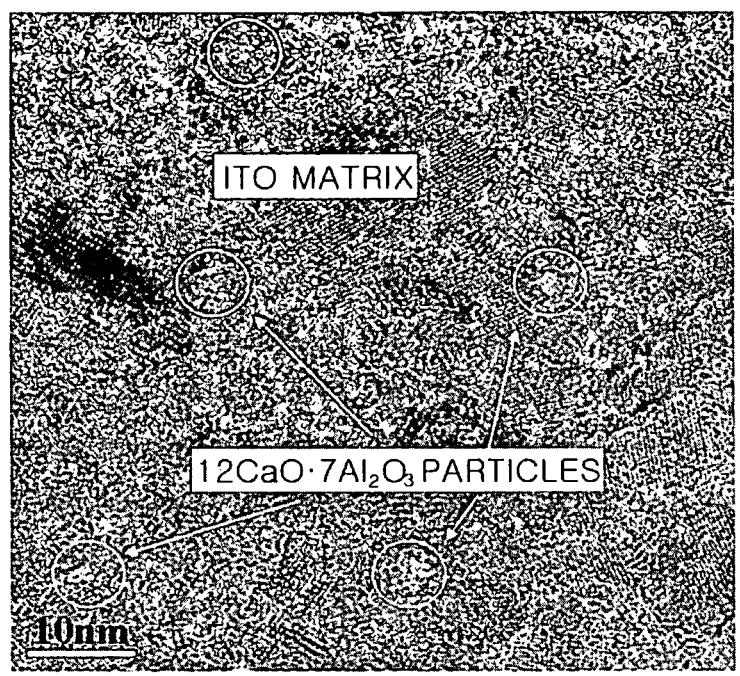
FIG. 6 is a high resolution transmission electrode microscopic (HRTEM) image of the surface of an electrode according to an embodiment of the present invention.

The surface of Sample 4, in which the partial pressure of $O_2$ was 1.4%, was determined using HRTEM. The results are shown in FIG. 6. Referring to FIG. 6, it can be seen that white $12CaO.7Al_2O_3$ particles were dispersed in the ITO matrix. In addition, it can also be seen that the minimum diameter of the $12CaO.7Al_2O_3$ particles of Sample 4 was 2 nm and the maximum diameter was 10 nm.

Assessment Example 5

Composition Analysis

Figure 7:
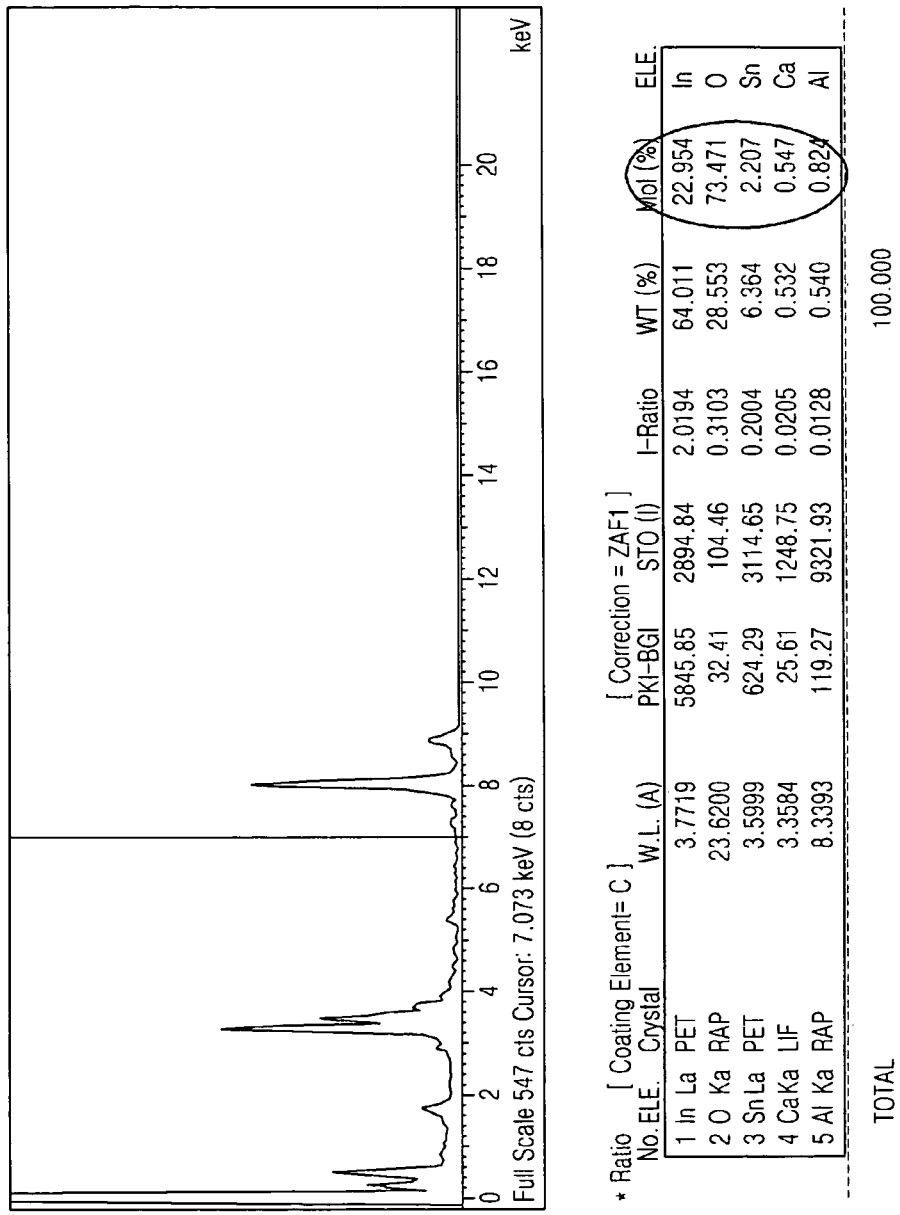
FIG. 7 shows analysis results of an electrode according to an embodiment of the present invention.

Sample 4, in which the partial pressure of $O_2$, was 1.4% was analyzed using an EPMA-1600 (Shimadzu). The results are shown in FIG. 7. Referring to FIG. 7, it can be seen that Sample 4 includes 0.532 wt % of Ca and 0.540 wt % of Al.

The electrode described above is suitable for various electronic devices, specifically an organic light emitting device, because of its low sheet resistance, high optical transmittance, and low work function.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting device comprising:
   a device substrate;
   a first electrode;
   an organic layer; and
   a second electrode;
   wherein the second electrode comprising a metal oxide and a plurality of $12CaO.7Al_2O_3$ particles,
   the metal oxide forms a matrix and the $12CaO.7Al_2O_3$ particles are dispersed in the matrix of the metal oxide.

2. The organic light emitting device of claim 1, wherein the $12CaO.7Al_2O_3$ particles have a minimum diameter of 2 nm or more and a maximum diameter of 80 nm or less.

3. The organic light emitting device of claim 1, wherein the concentration of the $12CaO.7Al2O3$ particles is in a range of 0.1 parts by weight to 5 parts by weight based on the total of 100 parts by weight of the metal oxide and the $12CaO.7Al2O3$ particles.

4. The organic light emitting device of claim 1, wherein, in the $12CaO.7Al_2O_3$ particles, the total concentration of Ca is in a range of 0.1 parts by weight to 3 parts by weight based on the total of 100 parts by weight of the metal oxide and the $12CaO.7Al_2O_3$ particles.

5. The organic light emitting device of claim 1, wherein, in the $12CaO.7Al_2O_3$ particles, the total concentration of Al is in a range of 0.1 parts by weight to 3 parts by weight based on the total of 100 parts by weight of the metal oxide and the $12CaO.7Al_2O_3$ particles.

6. The organic light emitting device of claim 1, wherein the metal oxide is one or more metal oxides selected from the group consisting of ITO, IZO, indium oxide, zinc oxide, $SnO2$, AZO, GaZO, GeZO, GaBZO, and StRuO.

7. The organic light emitting device of claim 1, wherein the sheet resistance of the electrode is in the range of 40 ohm/sq. to 500 ohm/sq.

8. The organic light emitting device of claim 1, wherein the optical transmittance of the electrode with respect to light in the visible light spectrum is 90% or more.

9. The organic light emitting device of claim 1, wherein the work function of the electrode is in a range of 4.0 eV to 4.6 eV.

10. The organic light emitting device of claim 1, wherein the thickness of the electrode is in the range of 50 nm to 200 nm.

* * * * *